United States Patent
Cheng et al.

(10) Patent No.: US 8,110,862 B2
(45) Date of Patent: Feb. 7, 2012

(54) SEMICONDUCTOR STRUCTURE INCLUDING TRENCH CAPACITOR AND TRENCH RESISTOR

(75) Inventors: Kangguo Cheng, Beacon, NY (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 12/499,452

(22) Filed: Jul. 8, 2009

(65) Prior Publication Data

US 2009/0267186 A1 Oct. 29, 2009

Related U.S. Application Data

(62) Division of application No. 11/306,709, filed on Jan. 9, 2006, now Pat. No. 7,560,761.

(51) Int. Cl.
*H01L 29/94* (2006.01)
*H01L 21/283* (2006.01)

(52) U.S. Cl. ......... 257/301; 257/E21.004; 257/E21.008; 257/E27.092; 257/E29.346; 438/382; 438/386

(58) Field of Classification Search .......... 257/301
See application file for complete search history.

(56) References Cited

U.S. PATENT DOCUMENTS

| | | | |
|---|---|---|---|
| 4,686,552 A | 8/1987 | Teng et al. | |
| 4,933,739 A | 6/1990 | Harari | |
| 5,352,923 A | 10/1994 | Boyd et al. | |
| 5,382,541 A | 1/1995 | Bajor et al. | |
| 5,411,913 A | 5/1995 | Bashir et al. | |
| 5,683,939 A | 11/1997 | Schrantz et al. | |
| 5,814,547 A | 9/1998 | Chang | |
| 6,384,452 B1 | 5/2002 | Chittipeddi et al. | |
| 6,528,383 B1 | 3/2003 | Chakravarti et al. | |
| 6,683,345 B1 | 1/2004 | Adler et al. | |
| 6,744,090 B2 | 6/2004 | Kim | |
| 6,999,298 B2 | 2/2006 | Hackler, Sr. et al. | |
| 2002/0066916 A1 | 6/2002 | Hsu et al. | |
| 2004/0135188 A1 | 7/2004 | Rosa et al. | |

FOREIGN PATENT DOCUMENTS

DE 19960563 6/2001
EP 430168 6/1991

OTHER PUBLICATIONS

Extended Search Report.

*Primary Examiner* — Wael Fahmy
*Assistant Examiner* — Abul Kalam
(74) *Attorney, Agent, or Firm* — Scully, Scott, Murphy and Presser, P.C.; Ian D. MacKinnon, Esq.

(57) ABSTRACT

A structure and a method for fabrication of the structure use a capacitor trench for a trench capacitor and a resistor trench for a trench resistor. The structure is typically a semiconductor structure. In a first instance, the capacitor trench has a linewidth dimension narrower than the resistor trench. The trench linewidth difference provides an efficient method for fabricating the trench capacitor and the trench resistor. In a second instance, the trench resistor comprises a conductor material at a periphery of the resistor trench and a resistor material at a central portion of the resistor trench.

14 Claims, 4 Drawing Sheets

SEMICONDUCTOR STRUCTURE INCLUDING TRENCH CAPACITOR AND TRENCH RESISTOR

CROSS REFERENCE TO RELATED APPLICATION

This application is a divisional of U.S. patent application Ser. No. 11/306,709, filed Jan. 9, 2006.

BACKGROUND

Field of the Invention

The invention relates generally to capacitors and resistors within semiconductor structures. More particularly, the invention relates to capacitors and resistors efficiently fabricated within semiconductor structures.

In addition to the use of transistors and diodes as active devices within semiconductor circuits, it has also become common to use capacitors in conjunction with resistors as passive devices within semiconductor circuits. Capacitors in conjunction with resistors may, in some instances, be used to provide resonant circuits. In addition, the combination of capacitors and resistors is also used commonly within "system-on-chip" circuits that result from integrating analog devices, digital devices and passive devices on a single semiconductor substrate.

Although the design and development of semiconductor circuits that use capacitors in conjunction with resistors within the context of system-on-chip circuits and applications are common, consistent with other semiconductor circuits, they too are influenced by a continuing need to reduce device and structure dimensions, while increasing or maintaining device performance levels. To that end, passive devices, such as capacitors and resistors, are generally implemented within the context of deep trench capacitors and deep trench resistors. Deep trench capacitors and deep trench resistors are characterized by projected area dimensions from about 100 to about 200 nanometers (nm) upon a substrate, such as a semiconductor substrate. They also have depths from about 5 to about 10 microns within the substrate, such as a semiconductor substrate.

Boyd et al., in U.S. Pat. No. 5,352,923, teaches a trench resistor within an integrated circuit, as well as a method for fabricating the trench resistor. The trench resistor and the method disclosed in the '923 patent use a resistor trench having a larger linewidth at a pair of contact portions than at a central portion that separates the pair of contact portions.

Chakravarti et al., in U.S. Pat. No. 6,528,383, teaches a semiconductor structure comprising a deep trench capacitor and a deep trench resistor, as well as a method for fabrication thereof. A pair of deep trenches, which are used for the deep trench capacitor and the deep trench resistor, are etched simultaneously within a single semiconductor substrate.

Since semiconductor device performance requirements are certain to increase, and semiconductor device and structure dimensions are also certain to decrease, a need will continue to exist for providing semiconductor devices and structures with increased performance at decreased dimensions. Included are semiconductor devices and semiconductor structures that include capacitors in conjunction with resistors.

BRIEF SUMMARY

The invention provides a pair of structures comprising a trench capacitor in conjunction with a trench resistor on a single substrate, as well as a method for fabricating one of the structures. Within one of the structures, a capacitor trench, which is used for the trench capacitor, has a linewidth dimension that is less than the trench that is used for the trench resistor. In the other structure and the method, a trench resistor comprises: (1) a conductor material layer that does not contact a conductor region that comprises the resistor trench; and (2) a resistor material layer that does contact a conductor region that comprises the resistor trench.

The inventive structures are typically semiconductor structures, although the foregoing structures and method need not necessarily yield a semiconductor structure (i.e., the structure and method may use other than a semiconductor substrate).

A first structure, in accordance with the invention, comprises a trench capacitor and a trench resistor located within a single substrate. A capacitor trench, which is used for the trench capacitor, has a narrower linewidth dimension than a trench that is used for the trench resistor.

A second structure, in accordance with the invention, comprises a substrate comprising a capacitor trench and a resistor trench located therein. Each of the capacitor trench and the resistor trench further comprises a conductor region located within at least one of a sidewall and a bottom thereof. The structure also comprises a dielectric material layer completely covering the conductor region within the capacitor trench, but not completely covering the conductor region within the resistor trench. The structure also comprises a conductor material layer located upon the dielectric material layer and completely filling the capacitor trench but incompletely filling the resistor trench and not contacting the conductor region therein. Finally, the structure comprises a resistor material layer located filling the resistor trench and contacting the conductor region therein.

A method, in accordance with the invention, provides for forming a capacitor trench and a resistor trench within a substrate. Each of the capacitor trench and the resistor trench comprises a conductor region located within at least one of a sidewall and a bottom thereof. The method also provides for forming a dielectric material layer to completely cover the conductor region within the capacitor trench but not completely cover the conductor region within the resistor trench. The method also provides for forming a conductor material layer located upon the dielectric material layer and completely filling the capacitor trench but incompletely filling the resistor trench and leaving exposed and not contacting the conductor region therein. Finally, the method provides for forming a resistor material layer to fill the resistor trench and contact the conductor region therein.

BRIEF DESCRIPTION OF THE SEVERAL VIEWS OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DETAILED DESCRIPTION

The invention provides a pair of structures comprising a trench capacitor in conjunction with a trench resistor on a single substrate, as well as a method for fabricating one of the structures. Within one of the structures, a capacitor trench, which is used for the trench capacitor, has a linewidth dimension that is less than the trench that is used for the trench resistor. In the other structure and the method, a trench resistor comprises: (1) a conductor material layer that does not contact a conductor region that comprises the resistor trench; and (2) a resistor material layer that does contact a conductor region that comprises the resistor trench.

FIG. 1 to FIG. 4 show a series of schematic cross-sectional diagrams illustrating the results of progressive stages in fabricating a semiconductor structure comprising a trench capacitor and a trench resistor in accordance with a first embodiment of the invention.

Figure 1:
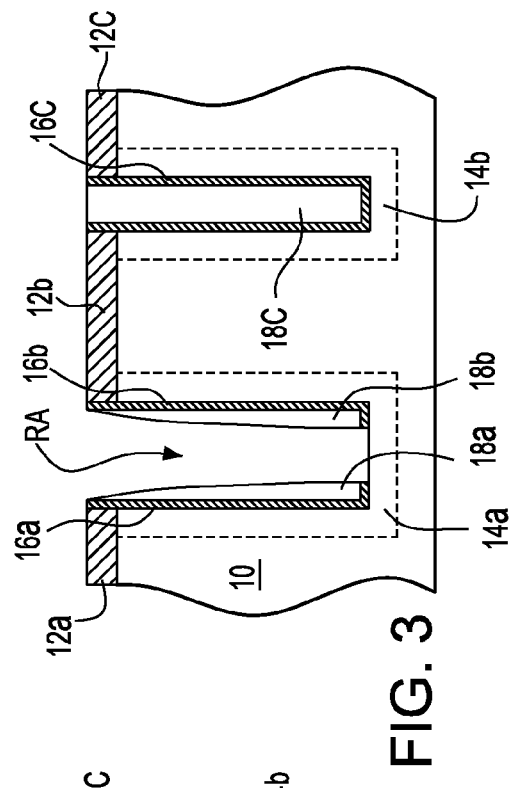
FIG. 1 to FIG. 4 show a series of schematic cross-sectional diagrams illustrating the results of progressive stages in fabricating a semiconductor structure comprising a trench capacitor and a trench resistor in accordance with a first embodiment of the invention.

FIG. 1 shows a semiconductor substrate 10 which includes a capacitor trench CT and a resistor trench RT located therein. Thus, the semiconductor substrate 10 is an etched semiconductor substrate. Sidewall locations of the capacitor trench CT and the resistor trench RT are defined by a series of patterned hard mask layers 12a, 12b and 12c located upon the semiconductor substrate 10. Finally, a resistor conductor connector region 14a surrounds the resistor trench RT within the semiconductor substrate 10 and a first capacitor plate region 14b (i.e., also generally a conductor region) surrounds the capacitor trench CT within the semiconductor substrate 10.

FIG. 1 also shows a resistor trench linewidth LWR and a capacitor trench linewidth LWC. The resistor trench linewidth LWR is greater than the capacitor trench linewidth LWC. Preferably, the resistor trench linewidth LWR is from about 1.2 to about 4 times the capacitor trench linewidth LWC. More preferably the resistor trench linewidth LWR is from about 1.5 to about 3 times the capacitor trench linewidth LWC. The resistor trench linewidth LWR is typically from about 1000 to about 5000 angstroms and the capacitor trench linewidth LWC is typically from about 500 to about 2000 angstroms. Each of the resistor trench RT and the capacitor trench CT typically has a single trench depth from about 4 to about 10 microns, although such a single trench depth for the resistor trench RT and the capacitor trench CT is not a limitation of the embodiment or the invention. Rather, within the embodiment and the invention, the depth of the resistor trench RT may or may not be the same as the depth of the capacitor trench CT.

Each of the semiconductor substrate 10, structures and layers that are illustrated in FIG. 1 may comprise materials and have dimensions that are conventional in the semiconductor fabrication art. Each of the semiconductor substrate 10, structures and layers that are illustrated in FIG. 1 may also be formed using methods that are conventional in the semiconductor fabrication art.

For example, the semiconductor substrate 10 may comprise semiconductor materials including, but not limited to: silicon, germanium, silicon-germanium alloy, silicon carbide, silicon-germanium carbide alloy and compound (i.e., III-V and II-VI) semiconductor materials. Non-limiting examples of compound semiconductor materials include gallium arsenide, indium arsenide and indium phosphide semiconductor materials. The semiconductor substrate 10 may also comprise a semiconductor-on-insulator (SOI) substrate such as, for example, a silicon-on-insulator substrate. The semiconductor substrate 10 may have a single crystal orientation or it may comprise surface regions that have different crystallographic orientations. The latter are referred to in the semiconductor art as hybrid substrates. Typically, the semiconductor substrate 10 comprises or consists of a silicon or silicon-germanium alloy semiconductor material having an appropriate bulk doping. A P-bulk doping is particularly common, but the invention is not so limited.

The series of patterned hard mask layers 12a, 12b and 12c may comprise a hard mask material such as, but not limited to: an oxide, a nitride and/or an oxynitride hard mask material. The series of patterned hard mask layers 12a, 12b and 12c may alternatively comprise composites or laminates of the foregoing hard mask materials. Typically, the series of patterned hard mask layers 12a, 12b and 12c will comprise a nitride or an oxynitride hard mask material located aligned upon a corresponding oxide hard mask material that additionally serves as a stress absorbing material.

The series of patterned hard mask layers 12a, 12b and 12c may be formed using any of several methods. Non-limiting examples include thermal oxidation methods, chemical vapor deposition methods (including plasma enhanced chemical vapor deposition methods and low pressure chemical vapor deposition methods), and physical vapor deposition methods. Typically, each of the series of patterned hard mask layers 12a, 12b and 12c has a thickness from about 500 to about 2000 angstroms.

Finally, the resistor conductor connector region 14a and the first capacitor plate region 14b (which is also a conductor region) typically result from introduction of an appropriate dopant into the semiconductor substrate 10 at the sidewall locations and floor (i.e., bottom) locations of the resistor trench RT and the capacitor trench CT. Non-limiting examples of dopant introduction methods include thermal diffusion methods, ion implantation methods, plasma doping methods, plasma ion immersion implantation methods, gas phase doping methods, solid phase doping methods, liquid phase doping methods, and any suitable combination of the foregoing methods. When the substrate 10 comprises a P-type semiconductor material, each of the resistor conductor connection region 14a and the first capacitor plate region 14b typically has an N-type doping from about 1e18 to about 1e22 dopant atoms per cubic centimeter. The N-type doping may be effected using an appropriate N-type dopant. Phosphorus and arsenic are examples of common N-type dopants.

To fabricate the semiconductor structure of FIG. 1, a semiconductor substrate (that is subsequently etched to form the semiconductor substrate 10) is first provided. A blanket hard mask layer is formed and located upon a surface of the semiconductor substrate. A series of patterned photoresist layers is formed and located upon the blanket hard mask layer. The series of patterned photoresist layers is used as a mask to form the series of patterned hard mask layers 12a, 12b and 12c from the blanket hard mask layer. At least the series of patterned hard mask layers 12a, 12b and 12c (and optionally also the series of patterned photoresist layers) is used as a mask to simultaneously etch the resistor trench RT and the capacitor trench CT within the semiconductor substrate 10. Finally, the resistor conductor connector region 14a and the first capacitor plate region 14b are then formed and located into the semiconductor substrate 10.

Figure 2:
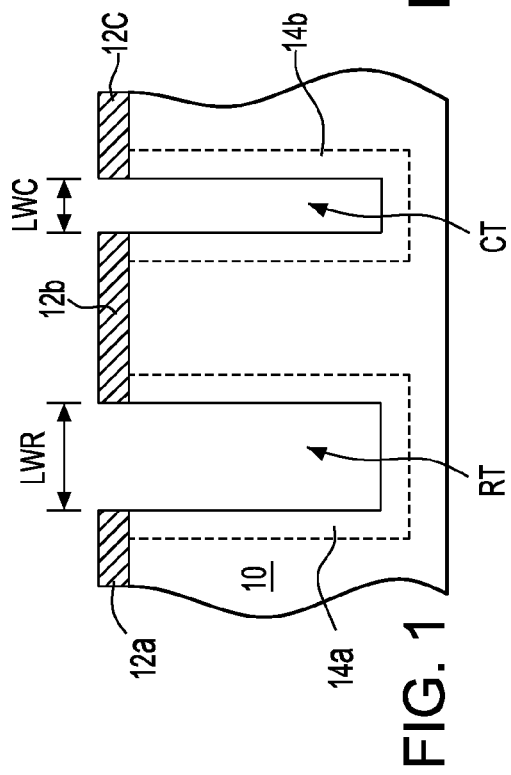

FIG. 2 shows a blanket first dielectric layer 16 formed and located upon the semiconductor structure illustrated in FIG. 1. The blanket first dielectric layer 16 is located contiguously covering top and sidewall portions of the series of patterned hard mask layers 12a, 12b and 12c, as well as sidewall and floor portions of the capacitor trench CT and the resistor trench RT. FIG. 2 also shows a blanket first trench fill layer 18 formed and located upon the blanket first dielectric layer 16.

The blanket first dielectric layer 16 may, in a first instance, comprise a generally conventional dielectric material such as an oxide, a nitride and/or an oxynitride dielectric material (typically of silicon, but other oxides, nitrides and oxynitrides are not excluded). The foregoing generally conventional dielectric materials have a dielectric constant from about 3 to about 20, measured in vacuum. Alternatively, the blanket first dielectric layer 16 may comprise a generally higher dielectric constant dielectric material having a dielectric constant from about 20 to at least about 100. Such generally higher dielectric constant dielectric materials may include, but are not limited to: hafnium oxides, hafnium silicates, titanium oxides, lanthanum oxides, barium strontium titanates (BSTs) and lead zirconate titanates (PZTs). Either of the foregoing two types of dielectric materials may be formed using any of several methods. Non-limiting examples include thermal oxidation methods, thermal nitridation methods, thermal oxynitridation methods, chemical vapor deposition methods (of several varieties), atomic layer deposition methods, and physical vapor deposition methods.

Typically, the blanket first dielectric layer 16 comprises at least in part a silicon nitride dielectric material having a thickness from about 20 to about 70 angstroms, although the invention is not so limited. Typically, the blanket first dielectric layer 16 is conformal and deposited using a chemical vapor deposition or atomic layer deposition method, although the invention is also not so limited.

The blanket first trench fill layer 18 is sized in thickness, and the resistor trench RT and the capacitor trench CT are sized in linewidth, so that the blanket first trench fill layer 18 fills completely at least at the top of the capacitor trench CT but does not completely fill the resistor trench RT. As disclosed above, typically, but not exclusively, the resistor trench RT will have a resistor trench linewidth LWR from about 1000 to about 5000 angstroms, and the capacitor trench will have a capacitor trench linewidth LWC from about 500 to about 2000 angstroms. The blanket first trench fill layer 18 will have a thickness from about 250 to about 1000 angstroms measured at the top of the patterned hard mask layers 12a, 12b, and 12c.

The blanket first trench fill layer 18 may comprise any of several trench fill materials that are appropriate to the invention. Conductor trench fill materials are most appropriate; semiconductor trench fill materials may under certain circumstances be applicable, but they are generally less desirable. Non limiting examples of conductor trench fill materials include a metal, a metal alloy, a metal nitride, a metal silicide, polycide and doped polysilicon (1e18 to 1e22 dopant atoms per cubic centimeter) conductor materials. Combinations and multilayers thereof are also contemplated. Preferably, the blanket first trench fill layer 18 is conformal and completely fills the entire capacitor trench CT. Alternatively, the blanket first trench fill layer 18 is formed to connect and pinch off at the top of the capacitor trench CT, thus yielding one or more voids buried within the capacitor trench CT.

The foregoing non-limiting examples of conductor trench fill materials may be formed using methods that are also conventional in the art. Non-limiting examples of methods include chemical vapor deposition methods, atomic layer deposition methods, physical vapor deposition methods, sputtering methods, thermal annealing methods, plasma treatment methods and ion implantation methods. Typically, the blanket conformal first trench fill layer 18 comprises a doped polysilicon trench fill material having the above described thickness from about 250 to about 1000 angstroms.

Figure 3:
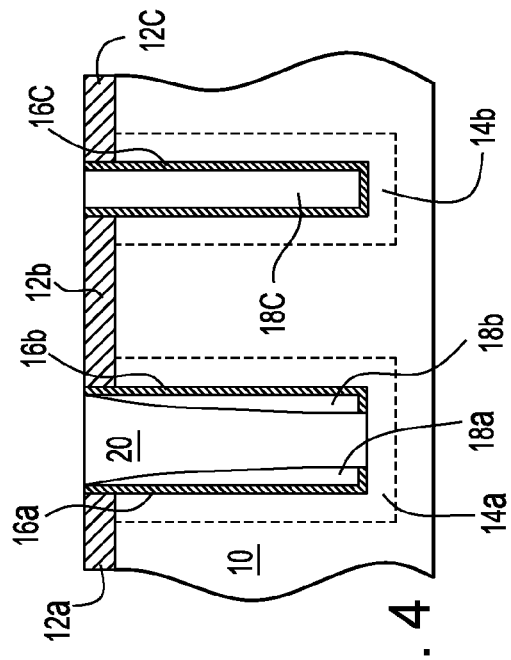

FIG. 3 shows: (1) a pair of patterned first trench fill layers 18a and 18b located at a periphery of the resistor trench RT and thus incompletely filling the resistor trench RT to thus define in part a resistor aperture RA (in particular, they also do not contact the resistor conductor connector region 14a); and (2) a second capacitor plate 18c located within the capacitor trench CT and completely filling the capacitor trench CT. FIG. 3 also shows: (1) a pair of patterned first dielectric layers 16a and 16b formed and located beneath the pair of patterned first trench fill layers 18a and 18b within the resistor trench RT; and (2) a patterned capacitor dielectric layer 16c interposed between the second capacitor plate 18c and the first capacitor plate region 14b. The pair of patterned first trench fill layers 18a and 18b, and the second capacitor plate layer 18c, as well as the pair of patterned first dielectric layers 16a and 16b and the patterned capacitor dielectric layer 16c, are typically formed incident to an anisotropic etching of the blanket first trench fill layer 18 followed by an etching (which may be either anisotropic or isotropic) of the blanket first dielectric layer 16.

Within the instant embodiment, the anisotropic etching is undertaken using an anisotropic etchant. It is typically an anisotropic plasma etchant. When the blanket first trench fill layer 18 comprises a doped polysilicon conductor material, it may be etched using a plasma etchant that comprises a chlorine containing etchant gas composition. After anisotropically etching the blanket first trench fill layer 18, a portion of the blanket first dielectric layer 16 at the bottom of the resistor trench RT is exposed, while no portion of the blanket first dielectric layer 16 is exposed at the bottom of the capacitor trench CT. The exposed portion of the blanket first dielectric layer 16 at the bottom of the resistor trench RT is then etched. When the blanket first dielectric layer 16 comprises a silicon oxide dielectric material or other silicon containing dielectric material, it may be etched using a plasma etchant that comprises a fluorine containing etchant gas composition. Alternatively, the blanket first dielectric layer 16 can be also be etched using a wet etching process that is typically an isotropic etching process. For example, when the blanket first dielectric layer 16 comprises a silicon oxide dielectric material, it may be efficiently etched using an aqueous solution containing hydrofluoric acid or a hydrofluoric acid material. As is illustrated in FIG. 3, the etching is undertaken to yield an exposed floor portion of the resistor aperture RA that comprises the resistor conductor connector region 14a. That is, this etching step exposes a portion of the semiconductor substrate 10 within the resistor trench RT when forming the resistor aperture RA.

Figure 4:
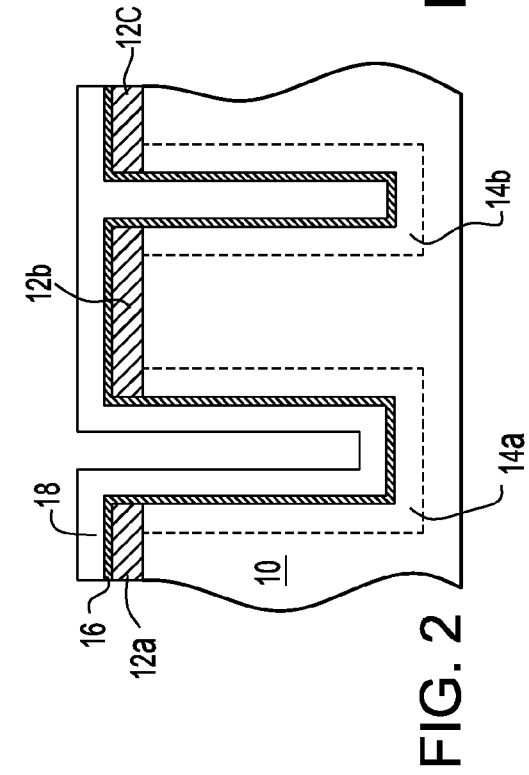
Figure 5:
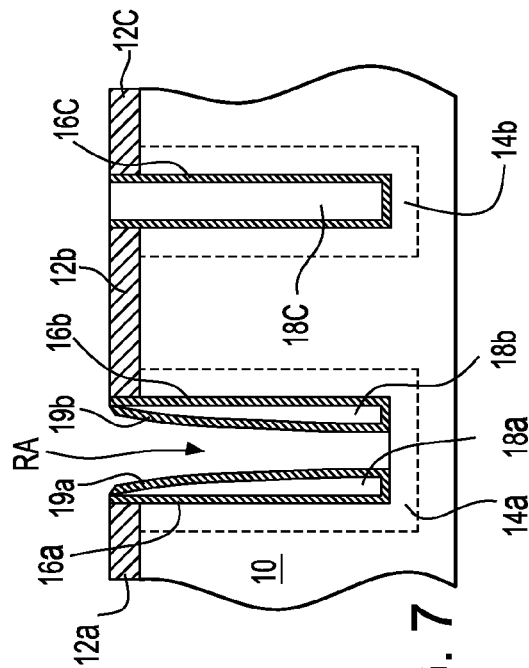
FIG. 5 to FIG. 8 show a series of schematic cross-sectional diagrams illustrating the results of progressive stages in fabricating a semiconductor structure comprising a trench capacitor and a trench resistor in accordance with a second embodiment of the invention.
Figure 7:
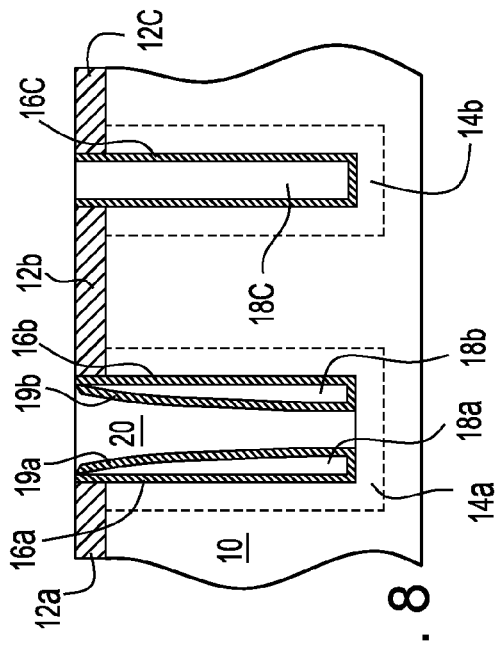
Figure 6:
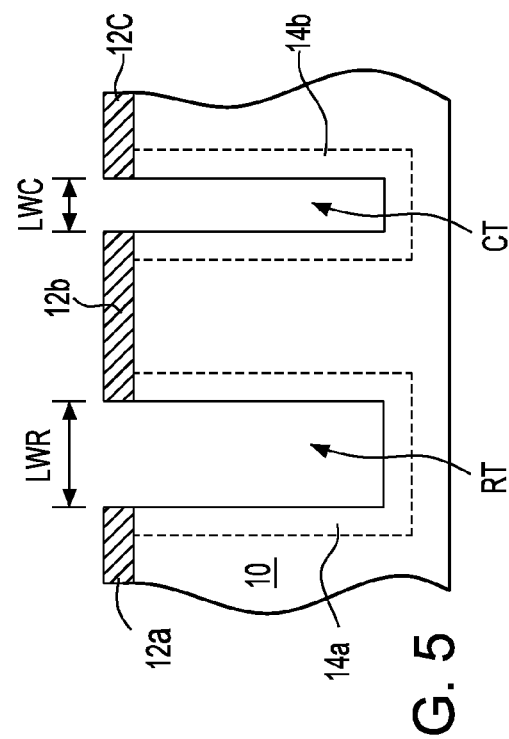

FIG. 4 shows a patterned second resistor fill layer 20 formed and located within the resistor aperture RA illustrated in FIG. 3. The patterned second resistor fill layer 20 may comprise any of several resistor materials. The resistor materials will typically have a higher resistivity than a conductor material from which is comprised the blanket first trench fill layer 18 that is illustrated in FIG. 2 or the patterned first trench fill layers 18*a* and 18*b* that are illustrated in FIG. 3. The resistor materials may also comprise some types of metal nitrides, metal silicides, polycides, semiconductor materials, and lesser doped polysilicon materials (i.e., having a dopant concentration from about 1e4 to about 1e10 dopant atoms per cubic centimeter), as well as perhaps even undoped polysilicon materials. The resistor materials may also be formed using methods analogous, equivalent or identical to the methods used for forming the blanket first trench fill layer 18.

Typically, the patterned second resistor fill layer 20 comprises a lesser doped polysilicon material (as described above), or an undoped polysilicon material, deposited using a chemical vapor deposition method. Other methods that are described above with respect to the blanket first trench fill layer 18 may also be used. Typically, the lesser doped polysilicon material is deposited as a blanket layer that has a thickness sufficient to completely fill the resistor aperture RA. The thickness will typically be from about 1000 to about 5000 angstroms, although the invention is not so limited. Excess portions of the blanket second resistor fill layer may then be planarized, often while using the series of patterned hard mask layers 12*a*, 12*b* and 12*c* as a planarizing stop layer. Any of several planarizing methods may be used. Non-limiting examples include reactive ion etch etchback planarizing methods, mechanical planarizing methods and chemical mechanical polish planarizing methods. Chemical mechanical polish planarizing methods are particularly common.

FIG. 4 shows a schematic cross-sectional diagram of a semiconductor structure having a trench capacitor and a trench resistor formed and located therein in accordance with a first embodiment of the invention.

The trench capacitor comprises the first capacitor plate region 14*b*, the patterned capacitor dielectric layer 16*c* and the second capacitor plate 18*c*. The trench resistor comprises the resistor conductor connector region 14*a*, the pair of patterned first dielectric layers 16*a* and 16*b*, the pair of patterned first trench fill layers 18*a* and 18*b*, and the patterned second resistor fill layer 20. As is illustrated in FIG. 4, the trench capacitor and the trench resistor are integrated within a single semiconductor substrate 10. The trench capacitor and the trench resistor are fabricated using a self aligned method. Incident to the self aligned method, a capacitor trench used for the trench capacitor has a linewidth dimension less than a resistor trench used for the trench resistor.

FIG. 5 to FIG. 8 show a series of schematic cross-sectional diagrams illustrating the results of progressive stages in fabricating a semiconductor structure having a trench capacitor and a trench resistor located therein in accordance with a second embodiment of the invention.

FIG. 5 to FIG. 8 correlate generally with FIG. 1 to FIG. 4, with identical reference numerals representing like or identical structures. In particular, FIG. 5 replicates FIG. 1 and FIG. 6 replicates FIG. 2. As an exception, however, FIG. 7 and FIG. 8 (in comparison with FIG. 3 and FIG. 4) show a pair of patterned conformal second dielectric layers 19*a* and 19*b* formed and located covering the pair of patterned first trench fill layers 18*a* and 18*b*. In conjunction with the pair of patterned first dielectric layers 16*a* and 16*b*, the pair of patterned conformal second dielectric layers 19*a* and 19*b* completely encapsulate the pair of patterned first trench fill layers 18*a* and 18*b*. Thus, within the second embodiment of the invention, the pair of patterned first trench fill layers 18*a* and 18*b* is completely isolated from the patterned second resistor fill layer 20. Thus, even if the pair of patterned first trench fill layers 18*a* and 18*b* comprises a highly conductive trench fill material, they do not influence any of the resistive properties of a resistive material from which is comprised the patterned second resistor fill layer 20.

The pair of patterned conformal second dielectric layers 19*a* and 19*b* may comprise materials, have thickness dimensions and be formed using methods analogous, equivalent or identical to the materials, dimensions and methods that are used for forming the pair of patterned first dielectric layers 16*a* and 16*b*. More typically, the pair of patterned conformal second dielectric layers 19*a* and 19*b* comprises a silicon oxide material that has a thickness from about 50 to about 150 angstroms. The silicon oxide material may be formed incident to a thermal annealing and oxidation (i.e., thermal oxidation) of the pair of patterned first trench fill layers 18*a* and 18*b* when they comprise a polysilicon material. Alternative materials and deposition methods may also be used, such as, but not limited to: chemical vapor deposition methods, thermal deposition methods, atomic layer deposition methods, and physical vapor deposition methods. Such deposition methods will typically form a blanket conformal second dielectric layer that is typically anisotropically etched to remove a portion of the blanket conformal second dielectric layer from the floor of the resistor aperture RA when forming the pair of patterned conformal second dielectric layers 19*a* and 19*b*.

Figure 8:
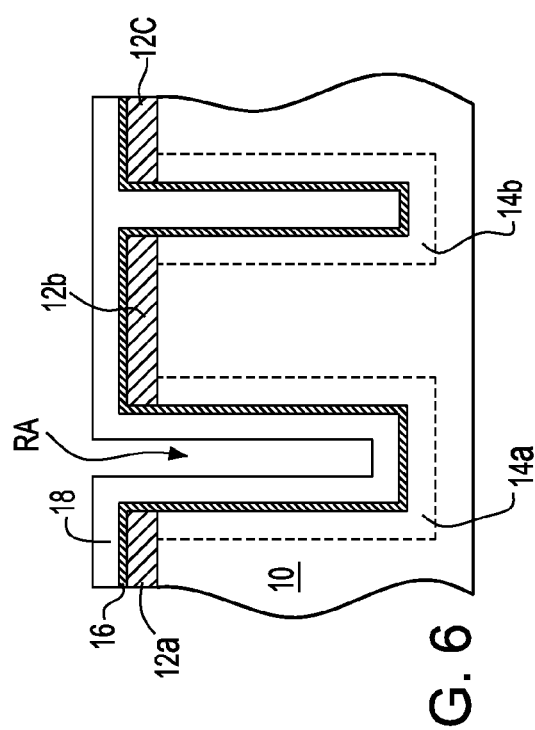

FIG. 8 shows a schematic cross-sectional diagram of a semiconductor structure comprising a trench capacitor and a trench resistor in accordance with a second embodiment of the invention. The second embodiment corresponds generally with the first embodiment insofar as both the second embodiment and the first embodiment have a trench capacitor that comprises a first capacitor plate region 14*b*, a patterned capacitor dielectric layer 16*c* and a second capacitor plate 18*c*. They are also generally similar insofar as the trench resistor comprises a resistor conductor connector region 14*a* in part separated from a patterned second resistor fill layer 20 by a pair of patterned first dielectric layers 16*a* and 16*b* and a pair of patterned first trench fill layers 18*a* and 18*b*. However, the second embodiment also includes a pair of patterned conformal second dielectric layers 19*a* and 19*b* that provide for complete electrical isolation of the pair of patterned first trench fill layers 18*a* and 18*b* from the patterned second resistor fill layer 20. Finally, within both the first embodiment and the second embodiment, a capacitor trench used for the trench capacitor has a narrower linewidth dimension than a resistor trench used for the trench resistor.

Figure 9:
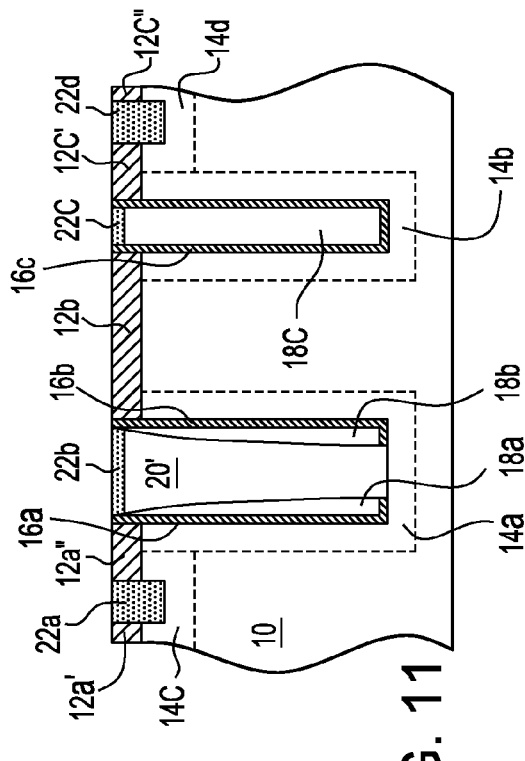
FIG. 9 to FIG. 11 show a series of schematic cross-sectional diagrams illustrating progressive stages of a first embodiment for interconnecting a trench capacitor and a trench resistor in accordance with the first embodiment of the invention.
Figure 11:
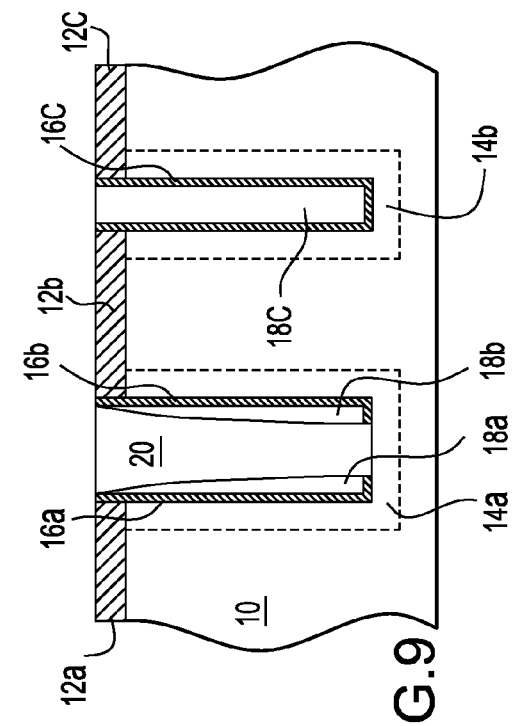
Figure 10:
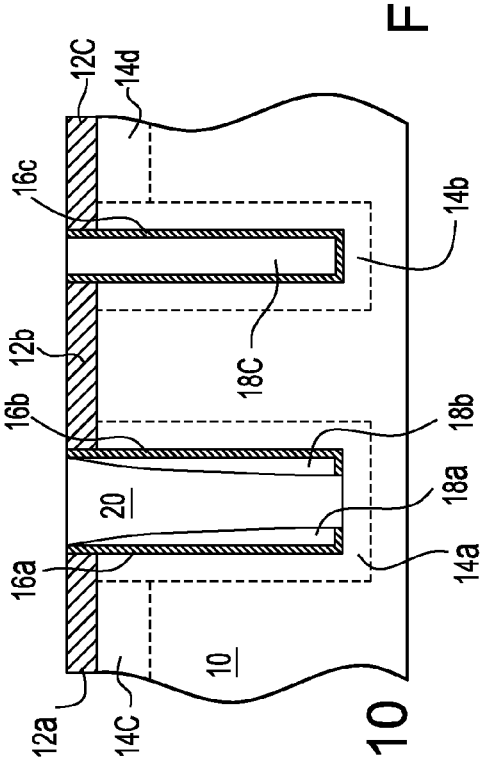

FIG. 9 to FIG. 11 show a series of schematic cross-sectional diagrams illustrating the results of forming a series of contacts to the semiconductor structure that comprises the trench capacitor and trench resistor that is illustrated in FIG. 4 (i.e., the first embodiment of the invention). In a first instance, FIG. 9 corresponds with FIG. 4, with identical reference numerals representing identical structures.

FIG. 10 shows a contact conductor connector region 14*c* located contiguous with the resistor conductor connection region 14*a* and a contact conductor connector region 14*d* contiguous with the first capacitor plate region 14*b*. Each of the contact conductor connector regions 14*c* and 14*d* is typically formed using an ion implant method with a dopant polarity and dose that approximates the dopant polarity and dose used for forming the resistor conductor connector region 14*a* and the first capacitor plate region 14*b*. Other dopant introduction methods may alternatively be used, but would typically require alternative processing schemes. Polarity of the dopants is the same.

When using an ion implant method, the pair of contact conductor connector regions 14c and 14d may be formed incident to an appropriate masking of the semiconductor structure of FIG. 9, followed by an appropriate ion implantation process step. The ion implantation process step preferably uses an ion implantation energy sufficient to penetrate the pair of patterned hard mask layers 12a and 12c.

FIG. 11 shows a series of contact regions 22a, 22b, 22c and 22d, one each located to contact each of the contact conductor connector regions 14c and 14d, the patterned second resistor fill layer 20 and the second capacitor plate 18c.

In order to provide a location for the pair of contact regions 22a and 22d, each of the patterned hard mask layers 12a and 12c is further patterned to provide a pair of twice patterned hard mask layers 12a' and 12a'' and a pair of twice patterned hard mask layers 12c' and 12c''. Such patterning of the pair of patterned hard mask layers 12a and 12c exposes portions of the contact conductor connector regions 14c and 14d that typically comprise a monocrystalline silicon material from which is comprised the semiconductor substrate 10. In accordance with disclosure above, each of the patterned second resistor fill layer 20 and the second capacitor plate 18c typically comprises a polysilicon material, albeit with differing dopant levels.

Each of the contact regions 22a, 22b, 22c and 22d typically comprises a silicide material that is otherwise conventional in the semiconductor fabrication art. Alternatively, the contact regions 22a and 22d may comprises doped polysilicon with an overlying silicide material. Other contact materials, such as certain metals, metal alloys and metal nitrides are not excluded, but they may be more difficult to process, or otherwise provide for a less efficient electrical connection to the trench capacitor and the trench resistor as illustrated in FIG. 11.

The contact regions 22a, 22b, 22c and 22d may comprise a metal silicide selected from the group including but not limited to: titanium, tungsten, cobalt and nickel silicides, and alloys thereof. Each of the contact regions 22a, 22b, 22c and 22d is typically formed using a self aligned silicide (i.e., salicide) method, although other methods are also not precluded. Such a self aligned silicide method provides for forming a metal silicide forming metal layer upon a silicon substrate (i.e., amorphous, polycrystalline or monocrystalline) and then thermally annealing the laminated structure to provide a region-selective metal silicide layer. Excess portions of unreacted metal silicide forming metal are removed using an etchant appropriate to the composition of the metal silicide forming metal. Specific metal silicide forming metals are generally etched within specific etchants that are typically wet chemical etchants. In some embodiments, a second thermal annealing may follow the selective etching process.

FIG. 11 shows a first embodiment of a conductor connection scheme for a trench capacitor and a trench resistor within a semiconductor structure in accordance with the first embodiment of the invention. The conductor connection scheme provides for wiring the trench capacitor separately from the trench resistor. The trench capacitor is: (1) wired to the first capacitor plate region 14b through the contact conductor connector region 14d and the contact region 22d; and (2) wired to the second capacitor plate 18c through the contact layer 22c. The trench resistor is: (1) wired to a first side of the patterned second resistor fill layer 20 (at the bottom of the resistor aperture RA) through the resistor conductor connector region 14a, the contact conductor connector region 14c and the contact region 22a; and (2) wired to an exposed second side of the patterned second resistor fill layer 20 through the contact region 22b.

Figure 12:
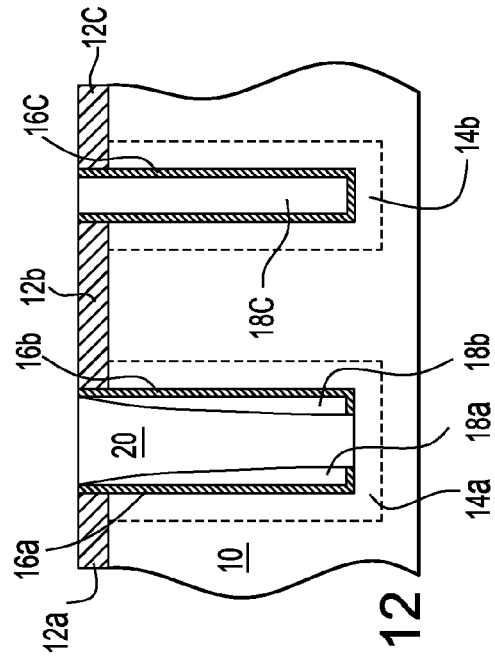
FIG. 12 to FIG. 14 show a series of schematic cross-sectional diagrams illustrating progressive stages of a second embodiment for interconnecting a trench capacitor and a trench resistor in accordance with the first embodiment of the invention.
Figure 13:
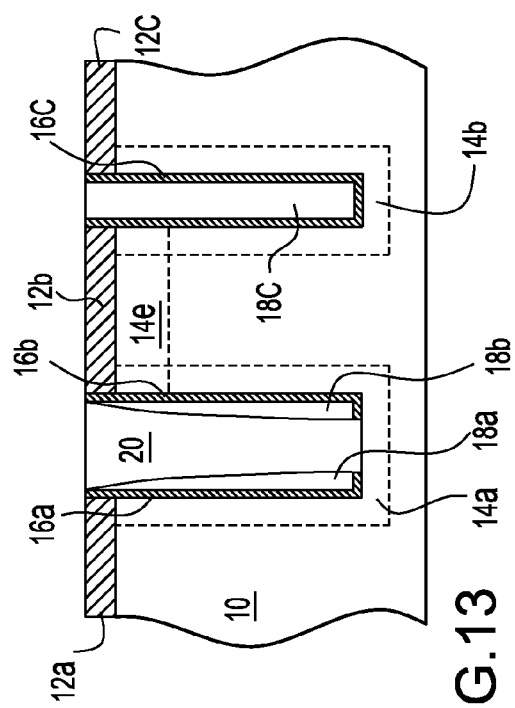
Figure 14:
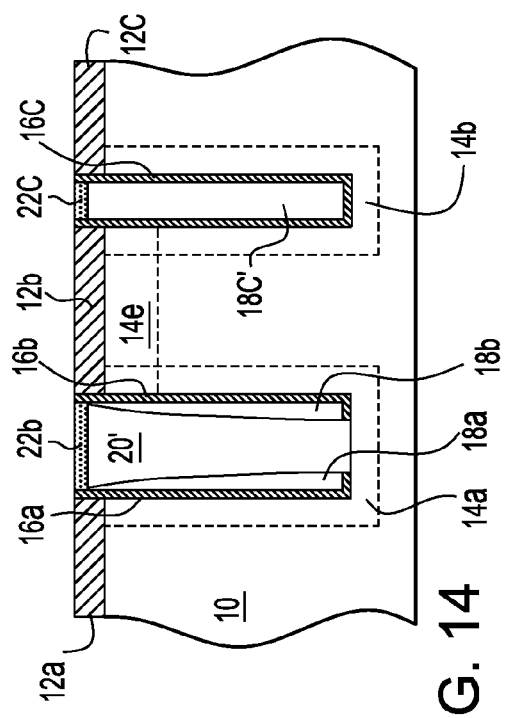

FIG. 12 to FIG. 14 show a series of schematic cross-sectional diagrams illustrating the results of forming a second embodiment of a contact structure for the semiconductor structure comprising the trench capacitor and trench resistor in accordance with the first embodiment of the invention.

FIG. 12 corresponds with, and is identical with, FIG. 9 and FIG. 4. Identical reference numerals are directed towards identical structures.

FIG. 13 shows a bridging conductor connector region 14e interposed between closest portions of the resistor conductor connector region 14a and the first capacitor plate region 14b. The bridging conductor connector region 14e may be formed using methods analogous, equivalent or identical to the methods used for forming the contact conductor connector regions 14c and 14d that are illustrated in FIG. 10.

FIG. 14 further shows the identical pair of contact regions 22b and 22c that are illustrated in FIG. 11. Again, they typically comprise silicide contact materials.

FIG. 14 shows a second embodiment for interconnecting a trench capacitor and a trench resistor within a semiconductor structure in accordance with the first embodiment of the invention. Within FIG. 14, the trench capacitor and the trench resistor are wired in series through use of the bridging conductor connector region 14e that connects the first capacitor plate region 14b within the trench capacitor and the resistor conductor connector region 14a within the trench resistor. The external connections to the trench capacitor in series with the trench resistor are through the contact regions 22b and 22c.

Figure 15:
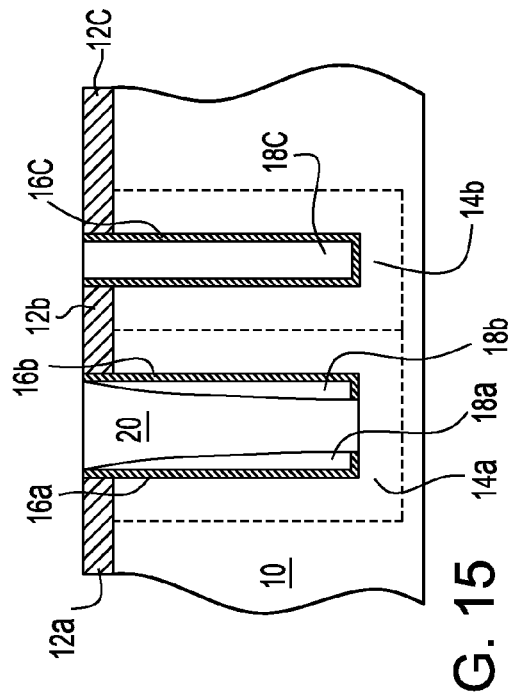
FIG. 15 to FIG. 16 show a pair of schematic cross-sectional diagrams illustrating progressive stages of a third embodiment for interconnecting a trench capacitor and a trench resistor in accordance with the first embodiment of the invention.
Figure 16:
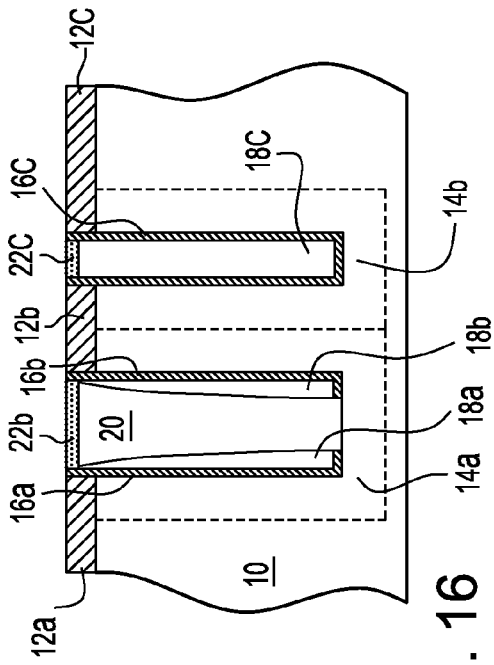

FIG. 15 and FIG. 16 show a pair of schematic cross-sectional diagrams illustrating a third embodiment for connecting a trench capacitor and a trench resistor within a semiconductor structure in accordance with the first embodiment of the invention.

FIG. 15 shows a trench capacitor and a trench resistor otherwise analogous to the trench capacitor and trench resistor illustrated in FIG. 4, FIG. 9 or FIG. 12, but where the resistor conductor connector region 14a within the trench resistor contacts the first capacitor plate region 14b within the trench capacitor. Thus, within the third embodiment of connecting the trench capacitor and the trench resistor there is no need for a bridging conductor connector region as there is in the second embodiment as illustrated in FIG. 13 and FIG. 14 (i.e., the bridging conductor connector region 14e) since electrical continuity between the resistor conductor connector region 14a and the first capacitor plate region 14b is effected incident to effective contact or overlap. As is illustrated within FIG. 16, the third embodiment still provides the pair of contact regions 22b and 22c for connection to the trench resistor and the trench capacitor otherwise connected in series.

Within the third embodiment for interconnecting the trench capacitor and the trench resistor, contact or overlap of the resistor conductor connector region 14a and the first capacitor plate region 14b may be effected by simply moving the trench resistor laterally closer to the trench capacitor. As an alternative, the resistor conductor connection region 14a and the first capacitor plate region 14b may be enlarged by use of a deeper ion implant. As an additional alternative, a structure that employs both of the foregoing alternatives may also be used.

The embodiments for connecting a trench resistor and a trench capacitor described in FIG. 9 to FIG. 16 are also applicable to the second embodiment of the invention shown in FIG. 8.

The preferred embodiments of the invention are illustrative of the invention rather than limiting of the invention. Revisions and modifications may be made to methods, materials, structures and dimensions of a semiconductor structure comprising a trench capacitor and trench resistor integrated within a single semiconductor substrate in accordance with the preferred embodiments of the invention, while still providing a structure comprising an integrated trench capacitor and trench resistor in accordance with the invention, further in accordance with the accompanying claims.

What is claimed is:

1. A structure comprising a trench capacitor and a trench resistor located within a single substrate, where a capacitor trench used for the trench capacitor has a narrower linewidth dimension than a resistor trench used for the trench resistor, said trench capacitor comprises a conductor material filling the capacitor trench, and said trench resistor comprises the conductor material located at a periphery of the resistor trench and a resistor material located at a center of the resistor trench wherein the resistor material is separated from the conductor material within the resistor trench by a dielectric material.

2. A structure comprising:
   a substrate comprising a capacitor trench and a resistor trench located therein, each of the capacitor trench and the resistor trench comprising a conductor region located within at least one of a sidewall and a bottom thereof;
   a dielectric material layer completely covering the conductor region within the capacitor trench but not completely covering the conductor region within the resistor trench;
   a conductor material layer located upon the dielectric material layer and completely filling the capacitor trench but incompletely filling the resistor trench and not contacting the conductor region therein; and
   a resistor material layer located filling the resistor trench and contacting the conductor region therein.

3. The structure of claim 2 wherein the capacitor trench has a narrower linewidth than the resistor trench.

4. The structure of claim 2 wherein the resistor material layer contacts the conductor material layer within the resistor trench.

5. The structure of claim 2 wherein the resistor material layer does not contact the conductor material layer within the resistor trench.

6. The structure of claim 2 further comprising a second dielectric material layer located interposed between and isolating the conductor material layer and the resistor material layer within the resistor trench.

7. The structure of claim 2 wherein the conductor region which comprises the capacitor trench contacts the conductor region which comprises the resistor trench.

8. The structure of claim 2 further comprising an additional separate conductor region located to connect the conductor region which comprises the capacitor trench with the conductor region which comprises the resistor trench.

9. A method for fabricating a structure comprising:
   forming a capacitor trench and a resistor trench within a substrate, each of the capacitor trench and the resistor trench comprising a conductor region located within at least one of a sidewall and a bottom thereof;
   forming a dielectric material layer to completely cover the conductor region within the capacitor trench but not completely cover the conductor region within the resistor trench;
   forming a conductor material layer located upon the dielectric material layer and completely filling the capacitor trench but incompletely filling the resistor trench and leaving exposed and not contacting the conductor region therein; and
   forming a resistor material layer to fill the resistor trench and contact the conductor region therein.

10. The method of claim 9 where the step of forming the capacitor trench and the resistor trench within the substrate comprises forming the capacitor trench with a linewidth narrower than the resistor trench within the substrate.

11. The method of claim 9 wherein the steps of forming the dielectric material layer and forming the conductor material layer comprise forming a blanket dielectric material layer within the capacitor trench and resistor trench and a blanket conductor material layer thereupon to completely fill the capacitor trench and incompletely fill the conductor trench, and then etching the blanket conductor material layer and blanket conformal dielectric material layer to expose the conductor region at a bottom of the resistor trench.

12. The method of claim 9 further comprising forming a second dielectric material layer located interposed between and isolating the conductor material layer and the resistor material layer within the resistor trench.

13. The method of claim 12 wherein the step of forming the second dielectric material layer comprises oxidizing the conductor material layer.

14. The method of claim 12 wherein the step of forming the second dielectric material layer comprises depositing the second dielectric layer upon the conductor material layer and the conductor region within the resistor trench, and then removing a portion of the second dielectric material layer from the conductor region within the resistor trench.

* * * * *